United States Patent
Standke

(10) Patent No.: US 7,878,289 B2
(45) Date of Patent: Feb. 1, 2011

(54) CONTROLLER FOR CONTROLLING A DRIVE MECHANISM OF A POWERED INDUSTRIAL TRUCK

(75) Inventor: Kurt Standke, Bonn (DE)

(73) Assignee: REMA Lipprandt GmbH & Co. KG, Bonn (DE)

( * ) Notice: Subject to any disclaimer, the term of this patent is extended or adjusted under 35 U.S.C. 154(b) by 310 days.

(21) Appl. No.: 12/090,996

(22) PCT Filed: Sep. 30, 2006

(86) PCT No.: PCT/EP2006/009512

§ 371 (c)(1),
(2), (4) Date: May 15, 2008

(87) PCT Pub. No.: WO2007/048481

PCT Pub. Date: May 3, 2007

(65) Prior Publication Data

US 2008/0223650 A1 Sep. 18, 2008

(30) Foreign Application Priority Data

Oct. 24, 2005 (DE) .................. 20 2005 016 726 U

(51) Int. Cl.
*B60K 26/00* (2006.01)
*G01B 7/30* (2006.01)

(52) U.S. Cl. ................ 180/335; 180/336; 180/315; 324/207.2

(58) Field of Classification Search ............. 180/315, 180/332, 335, 336, 19.1; 324/207.2, 207.21, 324/207.25, 207.22, 207.24, 173, 174

See application file for complete search history.

(56) References Cited

U.S. PATENT DOCUMENTS

| | | | |
|---|---|---|---|
| 6,276,485 B1 * | 8/2001 | Eriksson et al. | 180/332 |
| 6,640,652 B2 * | 11/2003 | Kikuchi et al. | 73/862.333 |
| 6,816,770 B1 * | 11/2004 | Lin | 701/93 |
| 2002/0118011 A1 * | 8/2002 | Wolf | 324/207.2 |
| 2004/0150391 A1 * | 8/2004 | Matsuzaki et al. | 324/207.2 |
| 2004/0257067 A1 * | 12/2004 | Mattson et al. | 324/207.2 |
| 2004/0263155 A1 * | 12/2004 | Schroeder et al. | 324/207.12 |
| 2005/0024045 A1 * | 2/2005 | Hagino et al. | 324/207.25 |
| 2005/0030012 A1 * | 2/2005 | Kunz-Vizenetz | 324/207.25 |
| 2005/0127903 A1 * | 6/2005 | Sogge | 324/207.2 |
| 2005/0174112 A1 * | 8/2005 | Wakabayashi et al. | 324/251 |
| 2005/0264282 A1 * | 12/2005 | Kawashima et al. | 324/207.25 |

FOREIGN PATENT DOCUMENTS

| | | | |
|---|---|---|---|
| DE | 32 13 151 | A1 | 10/1983 |
| DE | 34 31 523 | A1 | 3/1986 |
| DE | 43 28 427 | A1 | 3/1995 |
| DE | 195 03 615 | A1 | 8/1995 |
| DE | 197 56 475 | A1 | 6/1998 |
| DE | 197 49 330 | A1 | 5/1999 |
| DE | 696 03 998 | T2 | 1/2000 |
| DE | 200 04 887 | U1 | 6/2000 |
| EP | 0 900 719 | A1 | 3/1999 |
| EP | 1 180 473 | A1 | 2/2002 |

* cited by examiner

*Primary Examiner*—Ruth Ilan
(74) *Attorney, Agent, or Firm*—Sughrue Mion, PLLC

(57) ABSTRACT

A controller controlling the drive mechanism of a powered industrial truck has two Hall effect sensors, which are located at a lateral distance from one another, and a source of lines of magnetic flux, which can be displaced relative to the Hall effect sensors when the controller is actuated, so that the magnetic flux density changes in the Hall effect sensors.

10 Claims, 2 Drawing Sheets

CONTROLLER FOR CONTROLLING A DRIVE MECHANISM OF A POWERED INDUSTRIAL TRUCK

Figure 1:
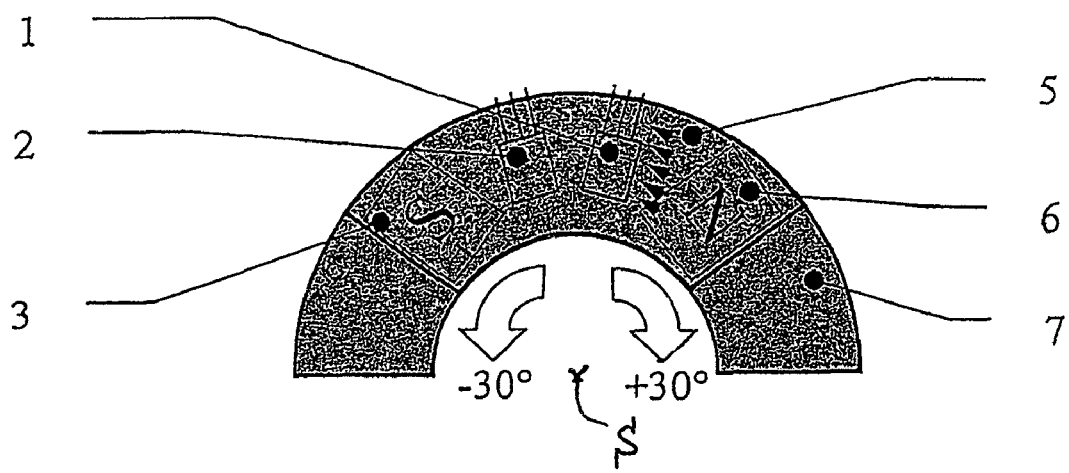

This application is the National Stage of International Application No. PCT/EP2006/009512, filed Sep. 30, 2006.

The invention relates to a controller for controlling the drive mechanism of a powered industrial truck. The European publication EP 1 180 473 A1 discloses a controller with a Hall effect sensor and two permanent magnets on a circular segment shaped magnet support. The magnet support has an opening between the permanent magnets into which the Hall effect sensor protrudes upright so that it is permeated by the magnetic field generated by the permanent magnets facing each other, which have opposite polarity. The magnet support is connected to a control handle operable by an operator such that one or the other permanent magnet gets closer to the Hall effect sensor when the control handle is pivoted relative to the Hall effect sensor so that the magnetic field permeating the Hall effect sensor changes as a function of the magnitude of the actuation and therefore the pivoting of the magnet support. This induces a Hall voltage which varies depending on the pivot angle of the magnet support and which is used as a signal to control the motor of the industrial truck.

In practice it has been found that this controller is susceptible to faults. For example, the Hall voltage generated by the Hall effect sensor that corresponds to the center position of the magnet support and should therefore be interpreted as a "neutral" control signal, i.e., stoppage of the industrial truck, changes when, for example, the position of the Hall effect sensor gets out of alignment, which can be caused by an external shock. The controller therefore has a microswitch, which is actuated by the magnet support in its center position, i.e., neutral position. The microswitch is designed as a safety switch, i.e., it prevents a travel signal independent of the actual Hall voltage.

Although this prevents the industrial truck from moving despite the control handle being in its neutral position when the Hall effect sensor is out of alignment, the displacement has the effect of changing the dependence of the Hall voltage on the position of the control handle, so that, for example, when the magnet support is moved from its center position after the safety switch has been deactivated, the industrial truck starts up abruptly, or fails to start initially, depending on the direction in which the dependence of the Hall voltage on the control handle position has changed as a result of the displacement.

Furthermore, if the adjustment of the Hall effect sensor gets substantially out of alignment, a magnet can repeatedly knock against a surface of the Hall effect sensor on one side causing the connecting contacts of the Hall-effect sensor to bend repeatedly. After the controller has been actuated many times, this can cause fatigue fractures of the connecting contacts. This can be very dangerous for the operator because the signal that is then generated by the electronics, depending on how it is interpreted, corresponds to the desired value "full speed forward" or "full speed reverse" and the vehicle will abruptly start to move unless there are additional safety systems.

In addition, the microswitch is subject to a certain amount of wear because it operates mechanically, so that its reliable functioning is not guaranteed over an unlimited period of time. In practice it has been found that with an increasing number of operating cycles the microswitch triggers increasingly later, i.e., at larger pivoting angles of the magnet support, which again causes the industrial truck to start up abruptly.

It is therefore an object of the invention to provide a controller that ensures reliable control of the drive mechanism of an industrial truck even over a large number of operating cycles of the controller.

This object is achieved by a controller as, for example, described below.

The controller according to the invention has two Hall effect sensors that are spaced at a lateral distance from each other and a source of lines of magnetic flux that are displaceable relative to the Hall effect sensors when the controller is actuated, so that the magnetic flux density in the Hall effect sensors changes. With the use of two Hall effect sensors, the drive signal for one direction, "forward," for example, can be generated by a first Hall effect sensor and the signal of the other Hall effect sensor can be used as a validity check and therefore a safety check. Correspondingly, the drive signal for the other drive direction, "reverse," for example, is generated by the other Hall effect sensor and the signal of the one sensor can be used as a validity check and therefore a safety check.

This design of the controller according to the invention has the following advantages over the prior art, among others:

The Hall effect sensors can be arranged in the magnetic field such that the magnetic flux density to be changed by operating the controller changes the Hall voltage of the one Hall effect sensor almost linearly with the actuation of the controller in one travel direction. Correspondingly, that of the other Hall effect sensor also changes almost linearly with the actuation of the controller in the other travel direction. In other words, both Hall effect sensors can be operated in a range in which their output signal—the Hall voltage—can be used to control the motor of the industrial truck in an analog manner. The Hall voltage of the respectively other Hall effect sensor, which is not operated in the almost linear range can then be used on the one hand to detect the travel direction and on the other hand as a safety check by providing a routine that disables the motor of the industrial truck if the two Hall effect sensors generate Hall voltages that have an unexpected ratio to each other.

Particularly preferred is an embodiment of the controller in which the Hall effect sensors are arranged flat on one side of a printed circuit board. This measure, in contrast to the upright arrangement of the Hall effect sensors known from the European publication EP 1 180 473 A1 substantially reduces their sensitivity to external mechanical influences because the Hall effect sensors can be attached to the printed circuit board in a much more stable manner. The magnetic flux density through the Hall effect sensors can be substantially increased if—as is particularly preferred—a yoke to guide the lines of magnetic flux is provided on the side of the printed circuit board opposite the Hall effect sensors. Increasing the flux density makes the controller less sensitive to external magnetic influences.

In principle, the source of the lines of magnetic flux can be designed in any manner that causes a change in the flux density through the Hall effect sensors when the controller is actuated. Because of the simplicity of the construction and the lack of susceptibility to faults it is preferred, however, to use two permanent magnets that are spaced at a lateral distance from each other as the source of the lines of magnetic flux. These permanent magnets are—particularly preferably—arranged above the Hall effect sensors, have an opposite polarity, such that the polar axes extend approximately perpendicular to the printed circuit board, and are displaceable in a plane approximately parallel to the printed circuit board when the controller is actuated. With this arrangement, tests have shown that, when the permanent magnets are displaced by ±30° in a circular arc about a neutral position, a change in the Hall voltages in the two Hall effect sensors can be produced in an approximately linear range. Furthermore, with this arrangement, in contrast to the arrangement described in EP 1 180 473 A1 in which the Hall effect sensor is located between the magnets, there is no longer any risk that the magnets will collide mechanically with the Hall effect sensors, so that the operational reliability of the controller according to the invention is further increased.

The magnetic flux density through the Hall effect sensors can be further increased—which is preferred—by connecting the permanent magnets by a yoke on the opposite side of the printed circuit board to guide the lines of magnetic flux.

As mentioned above, the permanent magnets are preferably displaceable along a circular orbit because controller handles are usually operated by rotation and the rotational operation can be easily transferred to a magnet support displacing the permanent magnets along a circular orbit.

The controller according to the invention preferably has a data processing unit, which receives the electrical signals generated by the Hall effect sensors and associates the signals with a travel speed and a travel direction. The signal used to determine the travel speed is the signal of a Hall effect sensor in which the magnetic flux density falls within a range where the electrical signal is a function of the magnetic flux density and, particularly preferably, changes at least almost linearly with the displacement of the permanent magnets in the case of displaced permanent magnets.

Particularly preferably, the controller further has a memory arrangement where the expected desired values for the electrical signals of the Hall effect sensors are stored as a function of the controller position, and a device to compare the desired values with the actual values generated by the Hall effect sensors, which brings about the "neutral" controller condition if the ratio of the actual values of the two Hall effect sensor signals is not as expected. In the controller according to the invention, a fail-safe circuit is preferably formed on the basis of this memory arrangement to ensure that the industrial truck is stopped if unexpected signal ratios indicate a fault in the controller. Because this fail-safe circuit works fully electronically it is not subject to mechanical wear in contrast to the prior art.

The "neutral" controller condition is also brought about if the device to compare the desired value with the actual value detects actual values that have the signal ratio expected for the neutral position.

Figure 2:
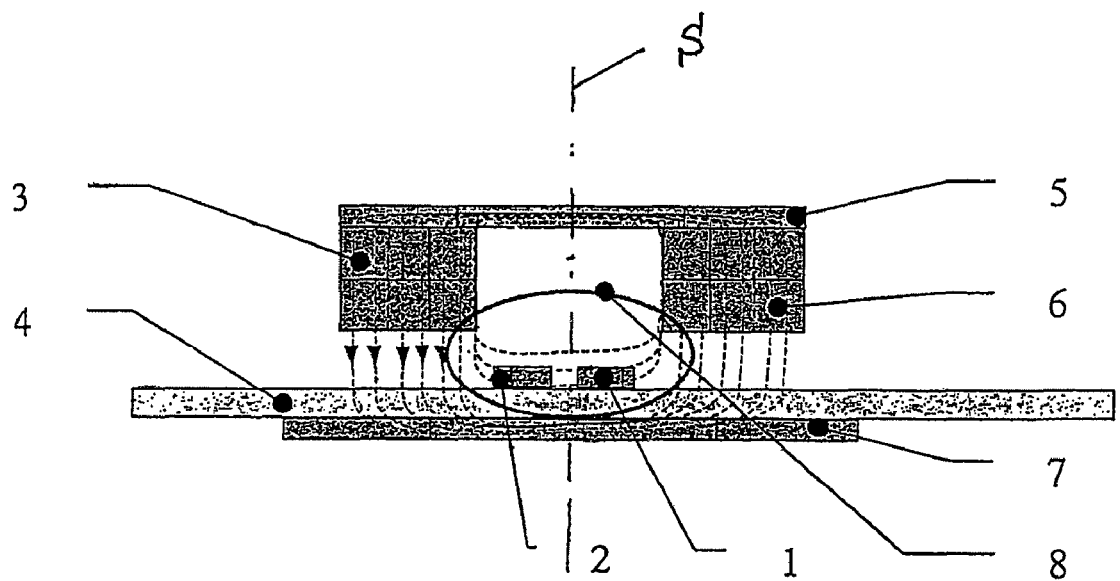
Figure 3:
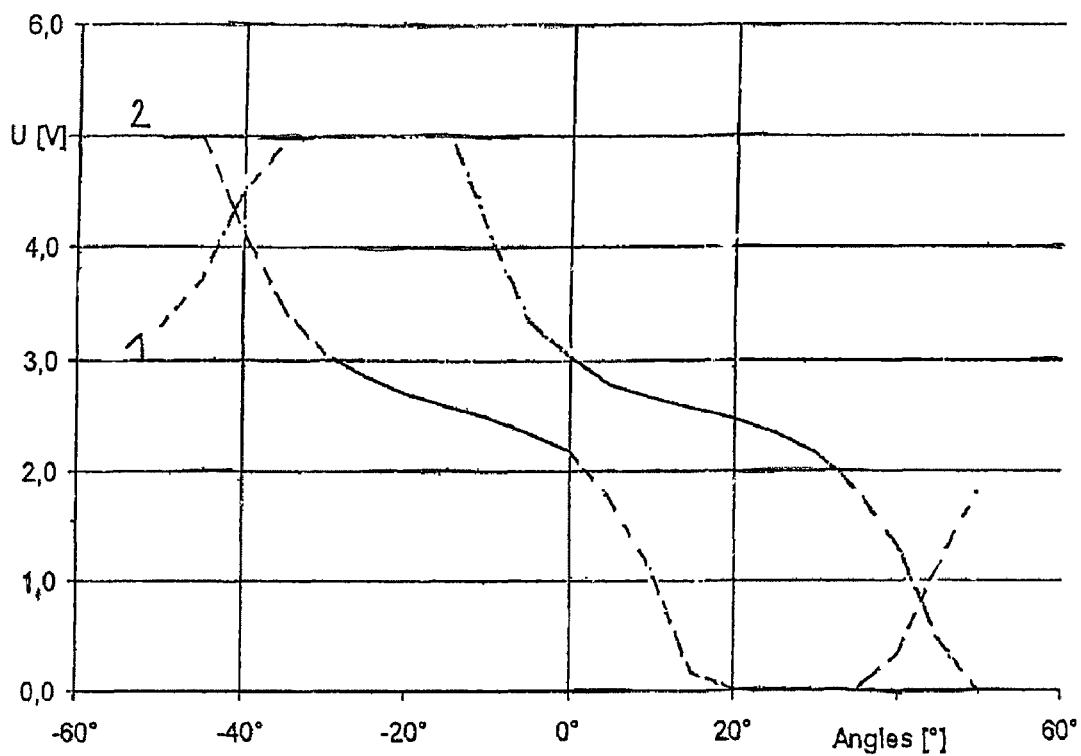
Figure 4:
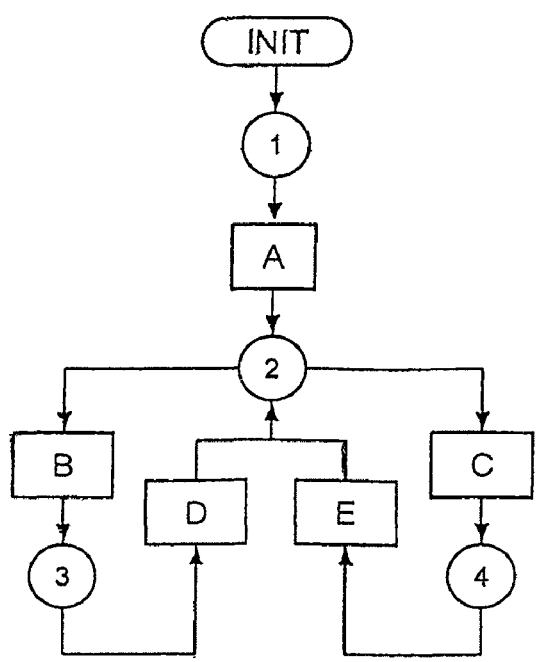

A preferred embodiment of the controller according to the invention will now be described in greater detail with reference to the attached drawings, in which:

FIG. 1 schematically shows the arrangement of the Hall effect sensors and the permanent magnets in a top view, FIG. 2 shows the arrangement of FIG. 1 in a side view—again schematically—(view A in FIG. 1), FIG. 3 shows the Hall voltages of the two Hall effect sensors as a function of the angular displacement of the magnet support from the neutral position, and FIG. 4 schematically shows the data processing sequence in the data processing unit.

The illustrated embodiment of the controller according to the invention includes a first Hall effect sensor 1 and a second Hall effect sensor 2, which are arranged along a circular arc at a lateral angular distance and mounted flat to one side of a printed circuit board 4. Above the printed circuit board 4, two permanent magnets 3, 6 are mounted to a yoke 5. The permanent magnets 3 and 6 are aligned such that their polar axes extend parallel but in opposite direction. The yoke 5 is used on one hand as a magnet support and on the other to focus and guide the lines of magnetic flux from one permanent magnet to the other.

The yoke 5 is part circular and displaceable by approximately ±30° about an axis S from its center position depicted in FIGS. 1 and 2.

The side of the printed circuit board 4 opposite the Hall effect sensors 1, 2 also has a yoke 7, which is likewise part circular and extends over an approximately 180° angular range. As a result, at an angular displacement of ±30°, the yoke 5 always has the yoke 7 underneath it, so that the lines of magnetic flux are always focused by the yoke 7 to form a closed, stabilized magnetic field whose lines of flux penetrate the sensors. In FIG. 2 this closed magnetic field is symbolized by the oval identified as 8.

FIG. 3 shows the Hall voltages generated by the magnetic field 8 in the Hall effect sensors 1, 2 as a function of the angular displacement of yoke 5 from the neutral position identified as 0° depicted in FIGS. 1 and 2. As can be seen, the dependence of the Hall voltage of the Hall effect sensor 1 in the range of 0 to +30° has an approximately linear course between 3 and 2 V. This range of the curve is represented by a solid line. Correspondingly, the Hall voltage of the Hall effect sensor 2 in the range of 0 to −30° has an almost linear dependence on the angle between 2 and 3 V. This range is also represented by a solid line. Because of this almost linear dependence, the Hall voltages are used by a data processing unit (not depicted) in an analog manner to control the motor of the industrial truck in terms of defining the desired speed. The analog voltage output signals are preferably converted by an A/D converter, processed and then transmitted to the motor control unit in digital form, for example in series, via a CAN bus, etc. The data processing unit uses the value of the Hall voltage of the respectively other Hall effect sensor, which is almost at a plateau within the almost linear range as indicated by a dashed line in FIG. 3, for a validity check in the sense that the motor of the industrial truck is stopped if the Hall voltage values beyond certain fault tolerances do not correspond to the expected desired values. To this end, the data processing unit checks whether the value of the Hall voltage of the respectively other Hall effect sensor is above or below a certain threshold value and as a function thereof generates a signal 0 or 1. The motor of the industrial truck is controlled by a travel signal only if the value of the Hall voltage of the respectively other Hall effect sensor is on the expected side of that threshold.

A preferred embodiment of the data processing unit, with which the Hall effect sensors 1, 2 are connected, generates the following output signals:

Motor control: Analog signal from the respective Hall effect sensor without directional information;

Neutral: Digital signal generated when the ratio of the Hall voltages of the Hall effect sensors 1 and 2 characteristic for the neutral position of the magnet support is detected;

Forward: Digital signal concerning the target direction, generated using the detected ratio of the Hall voltages of the Hall effect sensors 1 and 2;

Reverse: Digital signal that is correspondingly generated.

The following values are used by the data processing unit:

V1: The Hall voltage of the Hall effect sensor 1 at the full displacement of the magnet support in the positive direction of rotation, here at +30°

V2: The Hall voltage of the Hall effect sensor 1 at the maximum displacement of the magnet support in the negative direction of rotation, here at −30°

V3: The Hall voltage of the Hall effect sensor 1 at the boundary of the neutral position in the positive direction of rotation V4: The Hall voltage of the Hall effect sensor 1 at the boundary of the neutral position in the negative direction of rotation V11: The Hall voltage of the Hall effect sensor 2 at the full displacement of the magnet support in the positive direction of rotation, here at +30°

V12: The Hall voltage of the Hall effect sensor 2 at the maximum displacement of the magnet support in the negative direction of rotation, here at −30°

V13: The Hall voltage of the Hall effect sensor 2 at the boundary of the neutral position in the positive direction of rotation V14: The Hall voltage of the Hall effect sensor 2 at the boundary of the neutral position in the negative direction of rotation The data processing unit is further designed such that the output signals are passive in the neutral position, i.e., motor control=0, neutral signal=1, forward signal=0, reverse signal=0. The data processing unit switches to the active mode only when the magnet support is displaced from the neutral position and no fault condition is detected.

The processing sequence of the data processed by the data processing unit is illustrated in FIG. 4. In a first step A, the unit checks whether the Hall voltage of the Hall effect sensor 1 is within the range between V4 and V3 and the value of the Hall voltage 2 is within the range between V14 and V13. If this is not the case, the unit checks whether the Hall voltage of the Hall effect sensor 1 is greater than V3 and the Hall voltage of the Hall effect sensor 2 is greater than V13. The unit further checks whether the Hall voltage of the Hall effect sensor 1 is less than V4 and the Hall voltage of the Hall effect sensor 2 is greater than V14. If one of the above conditions is determined, the outputs of the data processing unit are in passive mode, i.e., the motor of the industrial truck is not operated. Only when none of the above Hall voltage conditions indicating either a neutral position of the magnet support or a fault condition is detected, the respective analog Hall voltage is used to calculate the control signal in the case where the Hall voltage of the Hall-effect sensor 1 is less than V3 or the Hall voltage of the Hall effect sensor 2 is greater than V14, namely as follows for the forward direction:

(Hall voltage of the Hall effect sensor 1−V3)/(V01−V03)*Vmax, where Vmax is the Hall voltage value corresponding to the maximum speed.

Correspondingly, the control signal for the reverse direction is calculated as follows:

(V14−Hall voltage of the Hall effect sensor 2)/(V14−V12)×Vmax

After the actual control value has been determined it is compared with the Vmax value and, if the actual value is greater, limited to Vmax.

Tests have shown that in the described embodiment the following voltage values are particularly suitable:

V03=2.336V

V04=1.755V

V13=3.33V

V14=2.786V

It is understood that other voltage values may be necessary for other embodiments of the controller according to the invention.

The standard values for the other parameters that have proven to be suitable are as follows:

V01=4.140V

V02=0.327V

V11=4.526V

V12=1.300V

These values can be changed, however, and stored in the data processing unit using the following three steps:

1. Maximum displacement of the magnet support in the positive direction and storage of the measured Hall voltages of the Hall effect sensor 1 as V01 and the Hall effect sensor 2 as V11

2. Maximum displacement of the magnet support in the negative direction of rotation and storage of the measured Hall voltages of the Hall effect sensor 1 as V02 and the Hall effect sensor 2 as V12

3. Storage of the changed values in a non-erasable memory of the data processing unit.

The invention claimed is:

1. A controller for controlling a drive mechanism of a powered industrial truck, comprising:
    two Hall effect sensors spaced at a lateral distance from each other,
    a source of magnetic flux lines displaceable relative to the Hall effect sensors when the controller is actuated, such that the magnetic flux density changes in the Hall effect sensors,
    a memory arrangement in which desired values for electrical signals of the Hall effect sensors are stored as a function of the controller position, and
    a device to compare the desired values with actual values generated by the Hall effect sensors and to adjust the actual values of the electrical signals of the two Hall effect sensors, to bring about a neutral controller condition if the comparison yields values differing from the desired values.

2. A controller as claimed in claim 1, wherein the Hall effect sensors are arranged flat on one side of a printed circuit board.

3. A controller as claimed in claim 2, wherein, on the side of the printed circuit board opposite the Hall effect sensors, a yoke is provided to guide the lines of magnetic flux.

4. A controller as claimed in claim 1, wherein the source of magnetic flux lines comprises two permanent magnets arranged at a lateral distance from each other.

5. A controller as claimed in claim 4, wherein the permanent magnets are arranged above the Hall effect sensors, have opposite respective polarities, with the polar axes extending approximately perpendicular to the printed circuit board, and are displaceable in a plane approximately parallel to the printed circuit board when the controller is actuated.

6. A controller as claimed in claim 5, wherein the permanent magnets are displaceable along a circular orbit.

7. A controller as claimed in claim 5, wherein the permanent magnets, on their sides facing away from the printed circuit board, are connected by a yoke to guide the lines of magnetic flux.

8. A controller as claimed in claim 7, wherein the permanent magnets are displaceable along a circular orbit.

9. A controller as claimed in claim 1, further comprising a data processing unit, which receives the electrical signals generated by the Hall effect sensors and associates a travel speed and travel direction with the electrical signals, wherein, to determine the travel speed, a signal of one of the Hall effect sensors is used for which the magnetic flux density falls within a range in which the electrical signal is a function of the magnetic flux density.

10. A controller as claimed in claim 1, wherein the device to compare and adjust the actual values is configured to bring about the neutral controller condition if the comparison yields values for the neutral position.

\* \* \* \* \*